(12) United States Patent
Seckin et al.

(10) Patent No.: US 11,601,101 B2
(45) Date of Patent: Mar. 7, 2023

(54) DIGITAL POWER AMPLIFIER WITH RF SAMPLING RATE AND WIDE TUNING RANGE

(71) Applicant: Apple Inc., Cupertino, CA (US)

(72) Inventors: Utku Seckin, Santa Clara, CA (US); Hanwen Yang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 63 days.

(21) Appl. No.: 17/366,964

(22) Filed: Jul. 2, 2021

(65) Prior Publication Data

US 2021/0408983 A1 Dec. 30, 2021

Related U.S. Application Data

(62) Division of application No. 16/551,618, filed on Aug. 26, 2019, now Pat. No. 11,057,009.

(51) Int. Cl.
| | |
|---|---|
| *H03F 3/217* | (2006.01) |
| *H04B 1/04* | (2006.01) |
| *H03K 19/20* | (2006.01) |
| *H03K 5/00* | (2006.01) |
| *H03K 5/135* | (2006.01) |

(52) U.S. Cl.
CPC ............ *H03F 3/2175* (2013.01); *H04B 1/04* (2013.01); *H03F 2200/165* (2013.01); *H03F 2200/324* (2013.01); *H03F 2200/378* (2013.01); *H03F 2200/451* (2013.01); *H03K 5/135* (2013.01); *H03K 19/20* (2013.01); *H03K 2005/00234* (2013.01)

(58) Field of Classification Search
CPC .................................. H03F 3/217; H03F 9/00
USPC ............................. 330/251.207 A, 165, 276
See application file for complete search history.

(56) References Cited

U.S. PATENT DOCUMENTS

| | | | |
|---|---|---|---|
| 7,800,437 B2 * | 9/2010 | Khoury ................. | H03F 3/2173 330/10 |
| 7,859,331 B2 | 12/2010 | Beale et al. | |
| 8,705,767 B2 | 4/2014 | Hiensch | |
| 9,467,097 B2 | 10/2016 | Kaya | |
| 11,057,009 B2 * | 7/2021 | Seckin ................. | H03F 3/2175 |
| 2021/0408983 A1 * | 12/2021 | Seckin .................... | H04B 1/04 |

* cited by examiner

*Primary Examiner* — Henry Choe
(74) *Attorney, Agent, or Firm* — Kowert, Hood, Munyon, Rankin & Goetzel, P.C.; Eric A. Heter; Dean M. Munyon (57) ABSTRACT

A switching power amplifier includes logic circuitry that generates first and second components of a differential signal, based on received amplitude code and a delayed version of the same. The amplitude code includes a sign and a magnitude. When the sign is positive, a first logic path is configured to generate the first component based on the received amplitude code and the second logic path is configured to generate the second component based on the delayed amplitude code. When the sign is negative, the first logic path is configured to generate the first component based on the delayed amplitude code and the second logic path is configured to generate the second component based on the received amplitude code. The switching power amplifier further includes a differential-to-single ended conversion circuit configured to generate a single-ended signal based on the differential signal.

20 Claims, 7 Drawing Sheets

DIGITAL POWER AMPLIFIER WITH RF SAMPLING RATE AND WIDE TUNING RANGE

RELATED APPLICATIONS

The present application is a divisional of U.S. application Ser. No. 16/551,618, filed Aug. 26, 2019 (now U.S. Pat. No. 11,057,009), the disclosure of which is incorporated by reference herein in its entirety.

BACKGROUND

Technical Field

This disclosure is directed to amplifier circuits, and more particularly, power amplifiers for wireless communications circuits.

Description of the Related Art

Digital power amplifiers, also known as switching power amplifiers, are commonly used in wireless communications systems. Relative to linear power amplifiers, switching power amplifiers offer better efficiency at back-off power (e.g., reduction of output power relative to a reduction of input power), since switching power amplifiers operate at their saturated power. In contrast, the efficiency of a linear power amplifier may be degraded at higher back-off power. Certain types of transmitters, such as ultra-wideband (UWB) transmitters, have a high peak-to-average power ratio, and thus may operate at higher back-off power. Thus, switching power amplifiers are commonly used in UWB transmitters.

SUMMARY

A switching power amplifier is disclosed. In one embodiment, a switching power amplifier includes logic circuitry that generates first and second components of a differential signal, based on received amplitude code and a delayed version of the same. The amplitude code includes a sign and a magnitude. When the sign is positive, a first logic path is configured to generate the first component based on the received amplitude code and the second logic path is configured to generate the second component based on the delayed amplitude code. When the sign is negative, the first logic path is configured to generate the first component based on the delayed amplitude code and the second logic path is configured to generate the second component based on the received amplitude code. The switching power amplifier further includes a differential-to-single ended conversion circuit configured to generate a single-ended signal based on the differential signal.

In various embodiments, the differential-to-single ended conversion circuit includes an inductive-capacitive (LC) tuning circuit including a first coil divided into a first sub-coil and a second sub-coil, wherein the LC tuning circuit further includes a first capacitor coupled in series between the first sub-coil and the second sub-coil. The first capacitor is, in one embodiment, a variable capacitor, and can be a switched capacitor.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f)

during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to digital power amplifier, or switching power amplifier. Most conventional Class-D PAs amplify a differential input signal through switching buffers and a series-LC network. Buffers provide a square-wave voltage which is then filtered by the series-LC network in current domain and converted through a balun to a single-ended signal at the output. Signal power can then be adjusted by adjusting the number of buffers that are actively switching compared to the number of buffers that are static, e.g., fully switched to either low or high state. For each buffer, a pre-driver with an enable signal (EN) can be used to adjust the number of drivers. Meanwhile, the series-LC network is tuned for desired transmit power and optimum efficiency.

Ultra-wideband (UWB) signals provide an opportunity to simplify the power amplifier design by using only a single core to generate the real signal that is needed to generate the required pulses at RF. To cover "negative magnitudes" of either pulse shape or the data, a simple inversion of the radio frequency (RF) clock signal may be sufficient.

Switching power amplifiers, in various embodiments, have two inputs: (1) the amplitude code and (2) the carrier (e.g., the clock signal at RF). Depending on the specific implementation, amplitude code may be considered as a signed-number or the sign can be treated as phase modulation to the carrier. In various embodiments of a switching amplifier according to this disclosure, a sign-magnitude amplitude code and a constant-phase carrier is used. The amplitude signal (or amplitude code) and the carrier are multiplied to generate first and second components of a differential signal used to drive the switching power amplifier units to generate the required pulses at RF frequency. This however presents a challenge in designing the operation of combining the clock signal and the amplitude code at RF without timing violations across process, voltage, and temperature variations. In particular, meeting both hold time and set up time requirements for the synchronization of the amplitude code and RF clock signal can be challenging. Using automated timing analysis tools cause overdesign which can be costly at RF. Accordingly, the switching power amplifier disclosed herein relaxes the timing requirements to meet setup and hold time requirements while still being able to combine the amplitude code and clock signal at RF.

The timing requirements may be relaxed by producing a replica of the amplitude code that is delayed by one-half cycle of a clock signal at RF frequency. Both components of the RF clock signal may be driven by either phase of the RF clock signal. The originally received version of the amplitude code may be evaluated on a first phase of the RF clock signal (e.g., when the RF clock signal is high) while the delay version may be evaluated based on a second phase of the RF clock signal (e.g., when the RF clock signal is low). This allows resulting enable signals a half-period of settling time.

Switching power amplifiers used in UWB transmitters typically have a wide tuning range requirement. Achieving a wide tuning range with a fixed LC tank is not preferred for output power and efficiency reasons. Some switching power amplifiers use series LC tuning at the output of the power amplifier. However this configuration can be difficult to tune. For example, tuning the series capacitor (e.g., coupled between a differential signal output and an inductor coil) degrades linearity, output power and efficiency since the series capacitor experiences the full signal swing. Alternative embodiments rely on switching the inductance, but this is also difficult and can degrade output power and efficiency. Another alternative embodiment involves placing a parallel capacitor on the input side of the balun (or inductor coil) to tune the tank circuit, but this can reduce the maximum power achievable due to capacitive division, particularly when a wide tuning range is needed.

The present disclosure contemplates a power amplifier in which the center-tap connection of the primary coil is broken and adding, in series, a variable capacitor (e.g., as a switched capacitor) in the signal path. Due to differential signaling, the switches inside the variable/switched capacitor array does not experience any signal swing in the on mode, if designed properly with low on-resistance. The original series capacitance may be increased such that the net series capacitance is at the desired value. When the variable capacitor is implemented as a switched capacitor, the reliability and linearity impact of the OFF mode switched-capacitors units can be addressed by proper biasing of the drain/source terminals in that mode.

Various embodiments of a switching amplifier implementing the solutions discussed above are now discussed in further detail.

Figure 1:
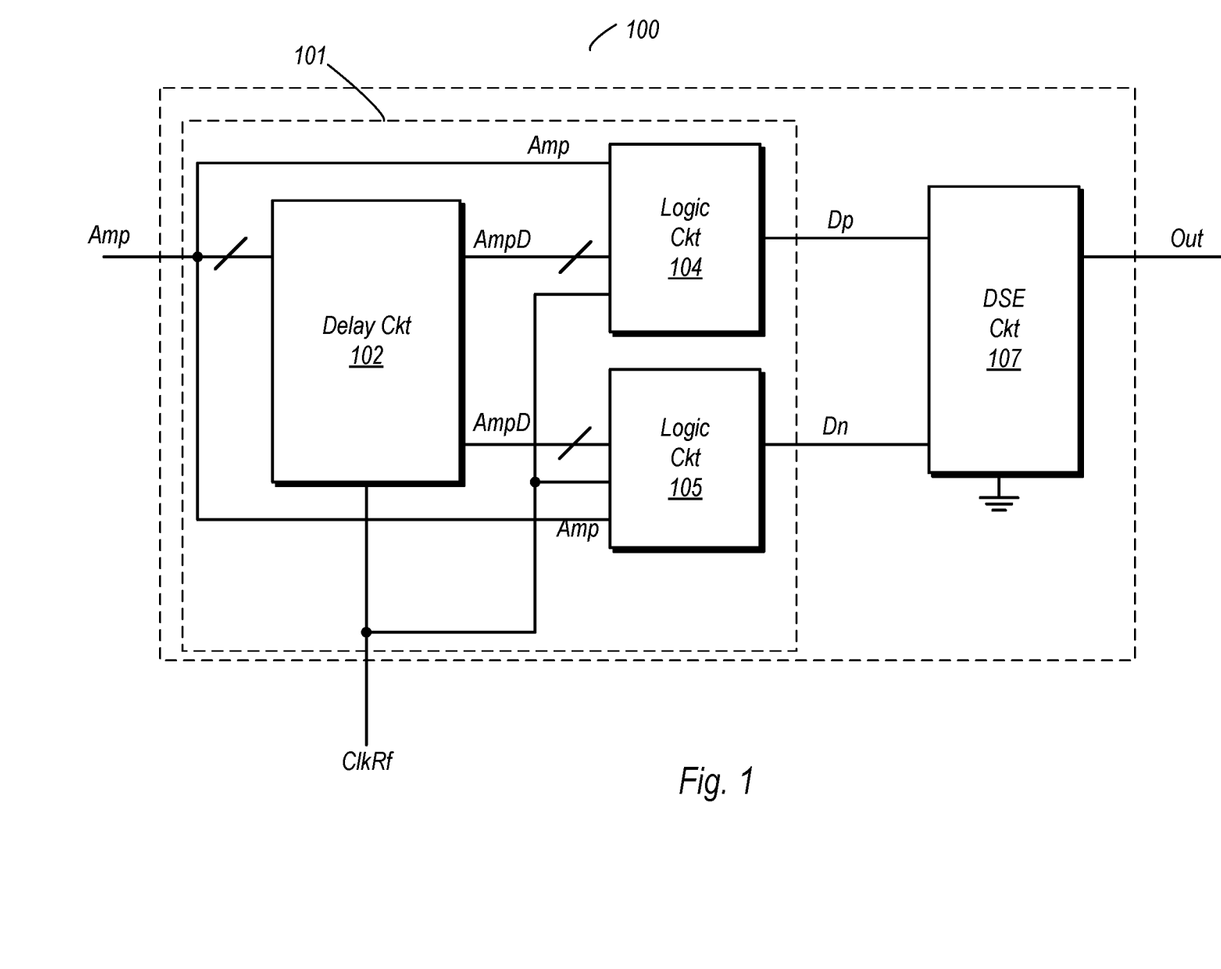
FIG. 1 is a block diagram of one embodiment of a switching amplifier.

FIG. 1 is a block diagram of one embodiment of a switching power amplifier (alternatively referred to as a digital power amplifier). In the embodiment shown, switching power amplifier 100 includes an input circuit 101 and a differential-to-single ended conversion (DSE) circuit 107. Input circuit 101 includes a delay circuit 102 as well as logic circuits 104 and 105. The output of these two logic circuits comprise a differential signal having a first component, Dp, and a second component, Dn, provided to DSE circuit 107. The output of DSE circuit 107, out, may be an amplitude modulated signal suitable for wireless transmission.

Delay circuit 101 in the embodiment shown receives amplitude code ('Amp'), e.g., a digital filter. The amplitude code is a multi-bit digital signal including a number of bits indicative of a magnitude and a sign bit indicating whether the value is positive or negative. Delay circuit 101 also receives a clock signal, ClkRf, the frequency of which corresponds to a carrier signal of, e.g., a transmitter in which switching power amplifier 100 is implemented. Using the first copy of the amplitude code, 'Amp', delay circuit 102 generates a second copy of the amplitude code, 'AmpD'. In the embodiment shown, AmpD has a value equivalent to Amp, but is delayed by one half cycle of ClkRf. Both Amp and AmpD are provided to logic circuits 104 and 105, along with the clock signal, ClkRf.

Logic circuit 104 in the embodiment shown generates a first component of the differential signal, Dp. Meanwhile, logic circuit 105 generates a second component of the differential signal, Dp. Generation of these signals is based at least in part on whether the sign contained in the amplitude code is positive or negative. When the sign is positive, the logic circuit 104 generates the first component, Dp, based on the received amplitude code, Amp, while logic circuit 105 generates the second component, Dn, based on the delayed amplitude code, AmpD. When the sign is negative, the logic circuit 104 generates Dp based on the delayed amplitude code, AmpD, while logic circuit 105 generates Dn based on the received amplitude code, Amp. When the sign is positive, Dp is driven by the clock signal, ClkRf, while Dn is driven by the opposite phase of ClkRf (referred to below as ClkRf_). When the sign is negative, Dp is driven by ClkRf_, while Dn is driven by ClkRf.

The differential signal components Dp and Dn are provided from input circuit 101 to DSE circuit 107. Taken collectively, Dp and Dn form an amplitude modulated differential signal having a carrier frequency equivalent to ClkRf. DSE circuit 107 converts the differential signal into a single-ended signal, 'Out', which is suitable for wireless transmission from an antenna.

Figure 2:
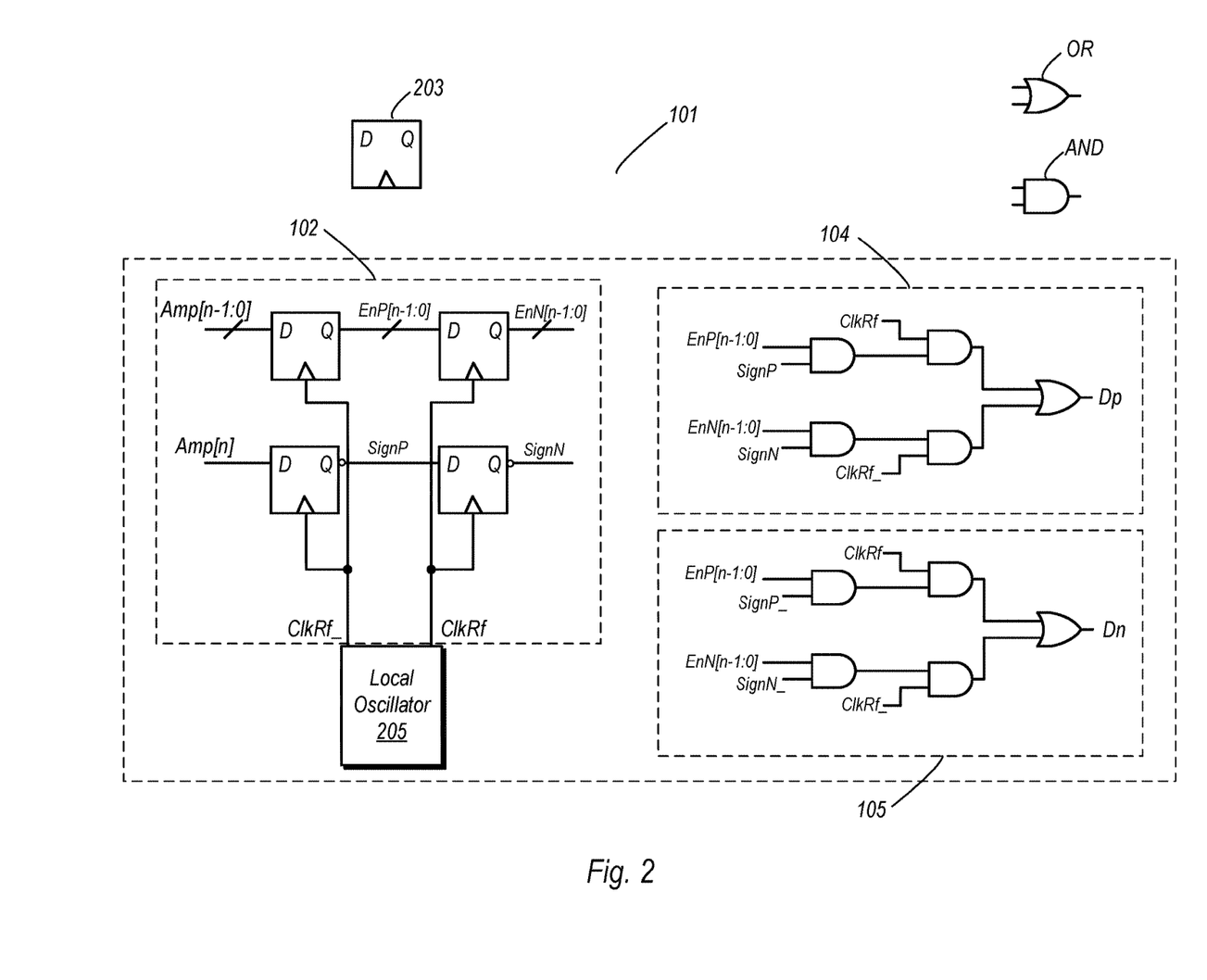
FIG. 2 is a diagram of one embodiment of an input circuit of a switching amplifier.

FIG. 2 is a diagram of one embodiment of an input circuit of a switching amplifier. In the embodiment shown, input circuit 101 includes a delay circuit 102, logic circuit 104, and logic circuit 105. Input circuit 101 in this particular embodiment also includes a local oscillator 205, although this component may be implemented separately from the other shown here. The delay circuit includes a number of flip-flops 203. Logic circuits 104 and 105 each include a number of AND gates and OR gates.

Amplitude code, Amp[n:0], is received in a group of magnitude bits, Amp[n−1:0], and a sign bit, Amp[n]. These bits are provided to correspondingly coupled ones of flip-flops 203. It is noted that only a single flip-flop 203 is shown as receiving Amp[n−1:0], the symbol shown in the drawing may in fact be representative of multiple flip-flops, one for each bit of the magnitude component of the amplitude code.

The output of the first set of flip-flops 203 (left-hand side), EnP[n−1:0] and SignP, are equivalent to the amplitude code as input. When ClkRf is low, its complement, ClkRf_ is high, and thus these flip-flops are transparent to the incoming amplitude code. When ClkRf goes high (and thus, ClkRf_ goes low), the amplitude code is captured. When ClkRf is high, the captured amplitude code, as EnP[n−1:0] and SignP, is captured into the second set of flip-flops 203 (right hand side). One half-clock cycle later, when ClkRf falls low again, the second set of flip-flops 203 outputs EnN[n−1:0] and SignN, which is effectively a delayed version of the previously received amplitude code.

Logic circuits 104 and 105 are identically arranged logic circuits in the embodiment shown, including a number of AND gates and a number of OR gates. It is noted that the AND gates receiving EnP[n−1:0] and EnN[n−1:0] may represent a number of AND gates, one for each bit of the magnitude portion of the amplitude value. Similarly, the number of OR gates providing the output signals Dp and Dn may match the number of bits. The outputs of the OR gates may be coupled together to generate the respective magnitudes of Dp and Dn.

Only one of the SignP or SignN bits is a logic high at a given time. When SignP is high (indicating a positive value), SignN_ is also high (while SignN is low). Similarly, when SignN is high (indicating a negative value), SignP is low while SignP_ is positive. These logic states affect which amplitude values are used to generate the Dp and Dn components of the differential signal.

When SignP is positive, logic circuit 104 generates Dp based on the received amplitude code (provided as EnP[n−1:0]), while logic circuit 105 generates Dn based on the delayed amplitude code (provided as EnN[n−1:0]). Furthermore, when the sign is positive, logic circuit 104 generates Dp in accordance with ClkRf, one half clock cycle before logic circuit 105 generates Dn.

When the sign is negative, Dp is generated by logic circuit based on the delayed amplitude code, and in accordance with ClkRf_, which is opposite in phase with respect to ClkRf. Accordingly, Dp is generated one half clock cycle later than Dn when the sign is negative. Logic circuit 105, when the sign is negative, generates Dn based on the received amplitude code, as SignP_ is also positive in this case. Furthermore, Dn, as noted above, is generated according to ClkRf instead of ClkRf_, and is thus generated one half clock cycle prior to the generation of Dp. Generally speaking, the received copy of the amplitude code is driven by the positive phase of ClkRf, while the delayed copy is driven by ClkRf_.

Figure 3:
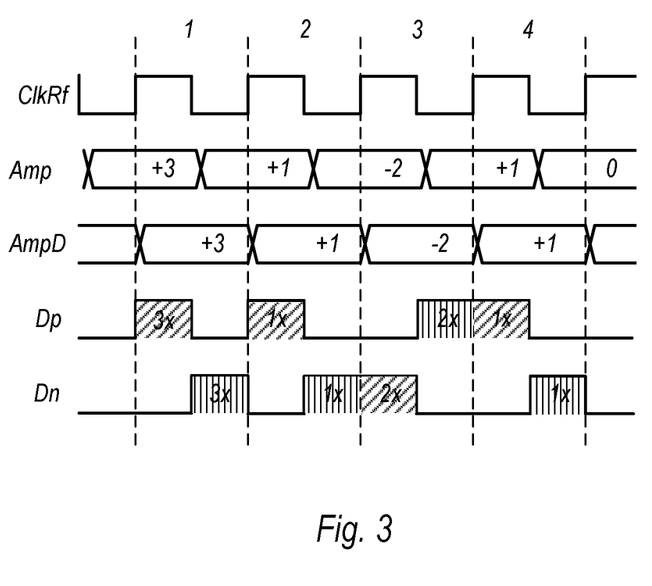
FIG. 3 is a timing diagram illustrating operation of one embodiment of an input circuit of a switching amplifier.

FIG. 3 is a timing diagram illustrating operation of one embodiment of an input circuit of a switching amplifier. In the illustrated example, the clock signal ClkRf is shown, although it is to be understood that its complement, ClkRf_ is used as well. When ClkRf is high, ClkRf_ is low, and vice versa.

'Amp' in the embodiment shown represents the received amplitude code, while 'AmpD' represents the delayed amplitude code. In Cycle 1 of the example, an amplitude code representing a value of +3 is received. Since the sign is positive in this cycle, Dp is generated prior to Dn, and is generated by the received amplitude code, while Dn is generated based on the delayed amplitude code. Furthermore, since the sign is positive, Dp is generated one half cycle prior to the generation of Dn, as shown in the timing diagram. The magnitude of both the Dp and Dn outputs is 3× for this cycle.

In Cycle 2, the received amplitude code represents a value of +1. Since the sign is positive, Dp is driven by ClkRf, while Dn is driven by ClkRf_. Thus, Dp is generated prior to Dn, by one half clock cycle. Dp is generated based on Amp, while Dn is generated based on AmpD.

In Cycle 3, the amplitude code is received representing a value of −2. Since the sign is negative in this case, Dn is generated prior to Dp. The received amplitude code, Amp, driven by ClkRf, is used to generate Dn when the sign is negative. Thereafter, the delayed amplitude code, AmpD, driven by ClkRf_, is used to generate Dp, one half clock cycle after the generation of Dn.

In Cycle 4, the received amplitude code represents a value of +1, and thus Dp is generated based on Amp, driven by ClkRf, while Dn is generated based on AmpD, driven by ClkRf_.

Figure 4:
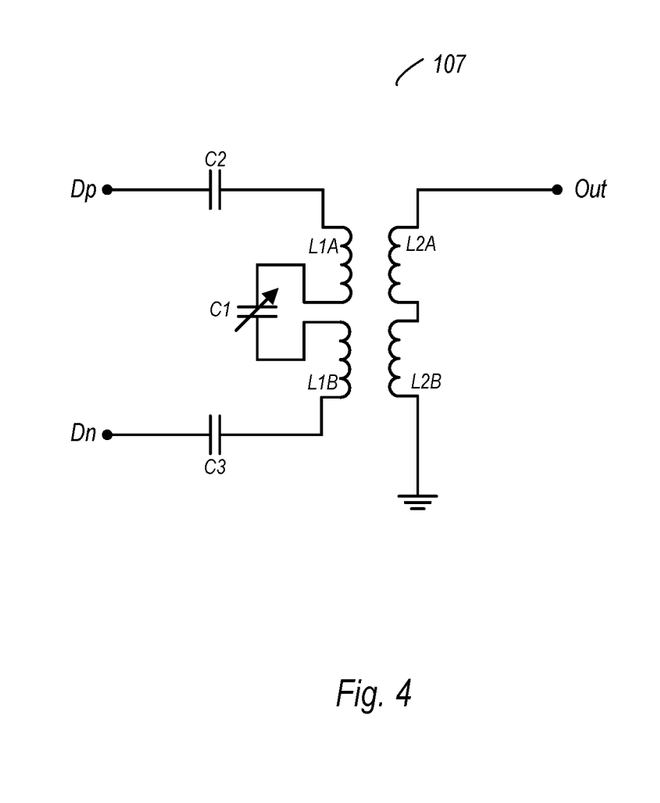
FIG. 4 is a schematic diagram of one embodiment of a differential-to-single ended converter circuit of a switching amplifier.

FIG. 4 is a schematic diagram of one embodiment of a differential-to-single ended converter circuit of a switching amplifier. In the embodiment shown, DSE circuit 107 includes a primary side and a secondary side. The primary side includes inductor L1, which is divided into sub-coils L1A and L1B, capacitors C1, C2, and C3. Capacitor C2 is coupled in series between the Dp terminal and L1A. Capacitor C3 is coupled between the Dn terminal and L1B. The secondary side includes inductor L2, shown here as divided into sub-coils L2A and L2B.

In the embodiment shown, the center tap of the primary coil L1 is broken to add a series capacitor C1. C1 is thus in coupled in series between L1A and L2A. As shown here, C1 is a variable capacitor, and in one embodiment, may be a switched capacitor. Due to differential signaling, when implemented as a switched capacitor, the switches of C1 inside the switched capacitor array (implemented using capacitor-coupled transistors) experiences no signal swing in ON mode, with proper low on-resistance. The original series capacitance (e.g., C2 and C3) may be increased in this case to ensure that the net series capacitance is at the desired value. With respect to the reliability and linearity impact of the off-mode switched capacitor, proper biasing of the source and drain terminals can be used to address this issue. The technique of placing a variable/switched capacitor in series with the inductor coils as shown in FIG. 4 may allow the amplifier to have a wide frequency range without degrading critical performance parameters, such as linearity, output power, and efficiency.

As shown in FIG. 4, the signal received on the primary side is a differential signal having components Dp and Dn. Energy from the differential signal is transferred through mutual inductance to coils L2A and L2B. Since L2B is coupled to ground at one terminal, the output signal, 'Out', is a single ended signal. Based on the operation described above in the input circuit, this signal is an amplitude modulated signal having a carrier frequency at RF, which corresponds to the clock signal frequency. Accordingly, the various embodiments of the switching amplifier disclose herein effectively performs direct amplitude modulation at a desired carrier frequency.

Figure 5:
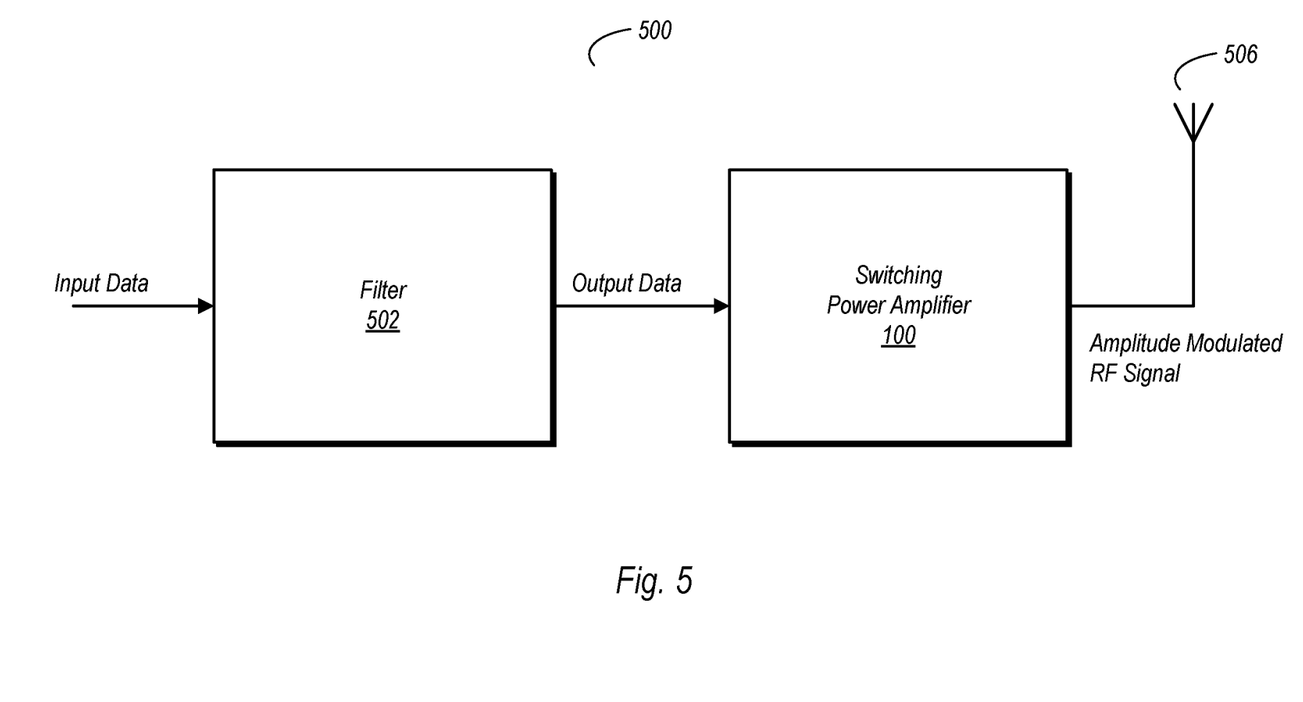
FIG. 5 is a block diagram of one embodiment of a transmitter.

FIG. 5 is a block diagram of one embodiment of a transmitter circuit having a filter and a power amplifier. In the embodiment shown, transmitter circuit 500 includes a filter 502 and a switching power amplifier 100. Filter 502 may be a digital filter that generates and provides its output data as amplitude code to switching power amplifier 100. Furthermore, in some embodiments, filter 502 may provide amplitude code to switching power amplifiers 100 at a data rate corresponding to the radio frequency of the transmitter system (e.g., ClkRf in the various circuits discussed above).

Switching power amplifier 100 in the embodiment shown may be a one of an embodiment falling within the scope of those discussed above. Switching may occur at the rate of the RF signal, which corresponds to the clock signal, ClkRf, as previously discussed. When receiving the modulation code at switching the carrier frequency, switching power amplifier 100 performs direct amplitude modulation at the RF. Accordingly, the output signal is an amplitude modulated signal based on the modulation code provided to switching power amplifier 100. The output signal, an amplitude modulated RF signal, may then be provided to antenna 506 for wireless transmission.

Figure 6:
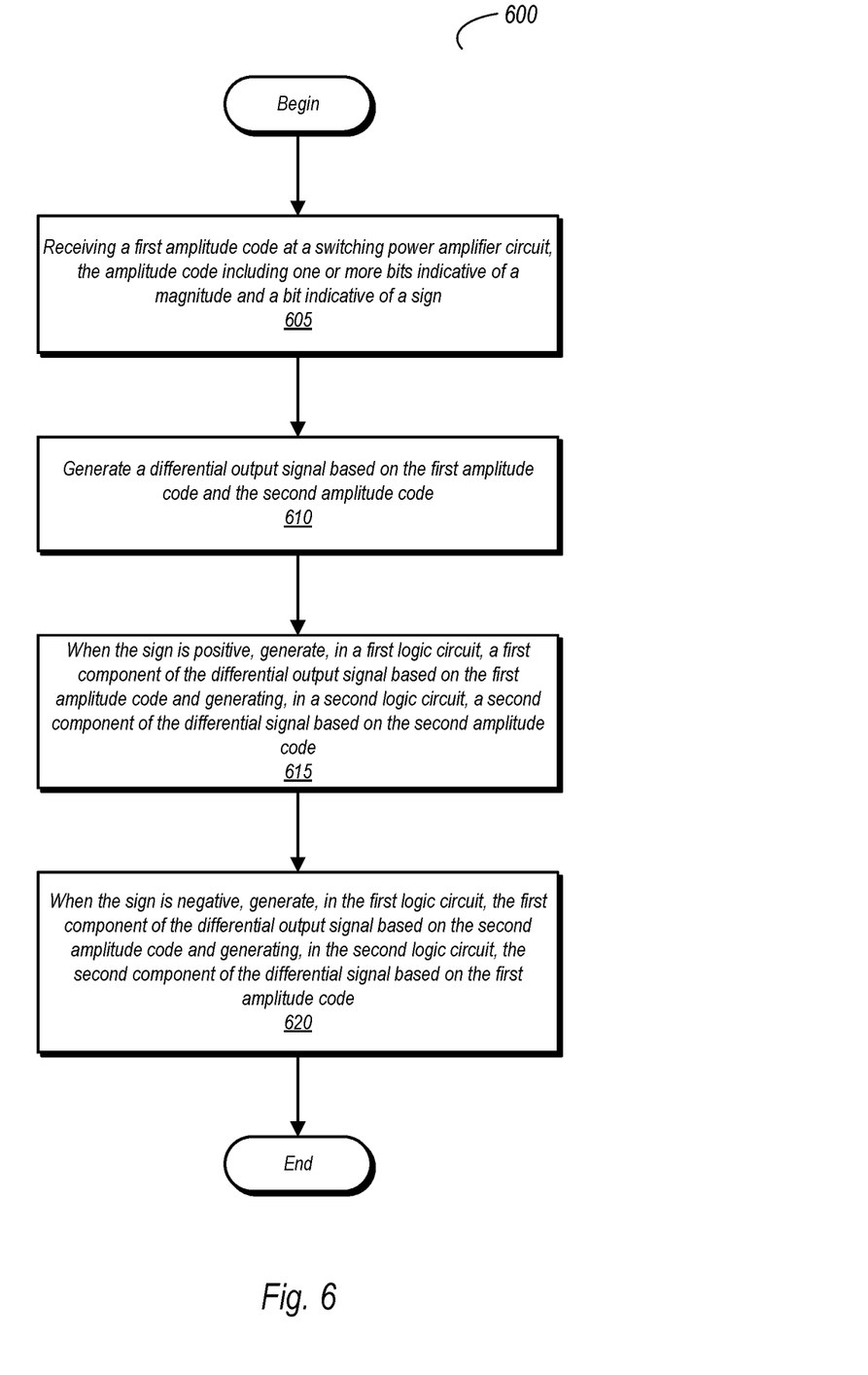
FIG. 6 is a flow diagram illustrating one embodiment of a method for operating a switching amplifier.

FIG. 6 is a flow diagram of one embodiment of a method for operating a switching power amplifier. Method 600 as discussed herein may be performed with any of the switching power amplifier embodiments discussed above and variations thereof. Embodiments of a switching amplifier not explicitly discussed herein are also contemplated as being able to carry out method 600, and may thus fall within the scope of this disclosure.

Method 600 begins with receiving a first amplitude code to a switching power amplifier circuit, the amplitude code including one or more bits indicative of a magnitude and a bit indicative of a sign (block 605). The method further includes generating, using a delay circuit, a second amplitude code, wherein the second amplitude code is a delayed version of the first amplitude code (block 610). A differential output signal is generated based on the first amplitude code and the second amplitude code. When the sign is positive, a first logic circuit generates a first component of the differential output signal based on the first amplitude code, while a second logic circuit generates a second component of the differential signal based on the second amplitude code (block 615). When the sign is negative, the first logic circuit generates the first component of the differential output signal based on the second amplitude code and the second logic circuit generates the second component of the differential signal based on the first amplitude code (block 620). In various embodiments, the differential signal is an amplitude modulated signal.

In various embodiments, the method includes providing, from a local oscillator, a clock signal to the delay circuit, wherein generating the second amplitude code comprises providing a delay of one half cycle of the clock signal to the delay. The frequency of the clock signal is a radio frequency (RF) of a transmitter circuit.

Embodiments are further contemplated wherein the method includes converting the differential signal to a single-ended signal using a differential-to-single ended conversion circuit, the differential-to-single ended conversion circuit comprising an LC tank circuit. Such embodiments may also includes setting a capacitance of the LC tank circuit by varying a capacitance of a capacitor coupled in series between a first sub-coil and a second sub-coil of the LC tank circuit.

Figure 7:
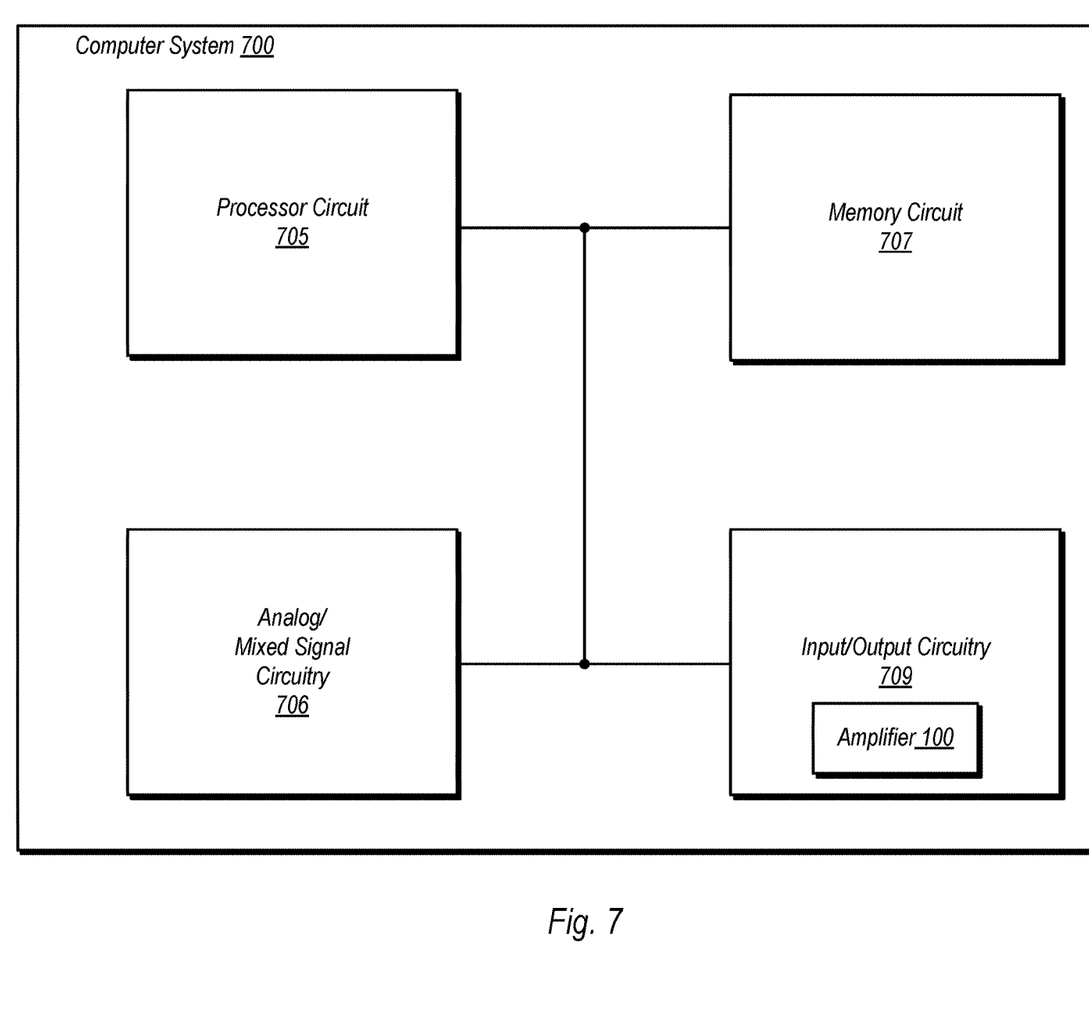
FIG. 7 a block diagram of one embodiment of a computer system.

FIG. 7 is a block diagram of one embodiment an example computer system. Computer system 700 in the embodiment shown includes a processor circuit 705, analog/mixed signal circuitry 706, memory circuit 707, and input/output circuitry 709. Input/output circuitry 709 includes an embodiment of amplifier 100 which falls within the scope of any of the various embodiments of the same discussed above.

Processor circuit 705 may be one of a number of different types of processors, e.g., a heterogeneous multi-core processor. In various embodiments, processor cores in processor circuit 705 may include cores optimized for performance, power consumption, or particular types of processing functions.

Memory circuit 707 may be one or more of a number of different types of memory, including random access memory (dynamic and/or static), graphics memory, flash memory, disk storage, and so on. Generally speaking, memory circuit 707 may implement any type of memory technology that allows for persistent storage of information.

Analog/mixed signal circuitry 706 may include a number of different types of circuits that include at least some analog functionality. Such circuits may include power supply circuits, such as voltage regulators used to provide supply voltages to other circuits within computer system 700. Metrology circuitry used to measure various circuit/performance parameters may also be included. Power management circuits may also be included in analog/mixed signal circuitry, and may implement functions to control power consumption and temperature in various parts of computer system 700.

Input/output circuitry 709 includes various circuits for conveying information to destinations external to computer system 709, as well as for receiving information from external sources. This may include circuitry for outputting information to a display, audio information, and so on. Input/output circuitry 709 may also include wireless communications circuitry, some of which may implement an embodiment of amplifier 100 as discussed herein.

Numerous variations and modifications will become apparent to those skilled in the art once the above disclosure is fully appreciated. It is intended that the following claims be interpreted to embrace all such variations and modifications.

What is claimed is:

1. A system comprising:
    a switching amplifier circuit including:
        an input circuit configured to generate a differential signal based on a received amplitude code and a clock signal, wherein a frequency of the clock signal is a radio frequency (RF) of a transmitter circuit; and
        a differential-to-single ended conversion circuit configured to generate a single-ended signal based on the differential signal, the differential-to-single ended conversion circuit having an inductive-capacitive (LC) tuning circuit including a first coil divided into a first sub-coil and a second sub-coil, wherein the LC tuning circuit further includes a first capacitor coupled in series between the first sub-coil and the second sub-coil; and
    an antenna, wherein the switching amplifier is configured to cause the antenna to wirelessly transmit an amplitude modulated signal received from the switching amplifier circuit.

2. The system as recited in claim 1, wherein the first capacitor is a variable capacitor.

3. The system as recited in claim 1, wherein the LC tuning circuit further includes a second capacitor coupled in series between a first output terminal of the input circuit and the first sub-coil, and a third capacitor coupled in series between a second output terminal of the input circuit and the second sub-coil.

4. The system as recited in claim 1, wherein the input circuit includes:
    a delay circuit configured to generate a delayed amplitude code by applying a delay to the received amplitude code; and
    logic circuitry having first and second logic paths configured to generate first and second components of the differential signal, respectively, based on the received amplitude code and the delayed amplitude code, wherein the amplitude code includes a sign and a magnitude.

5. The system as recited in claim 4, wherein, when the sign is positive, the first logic path is configured to generate the first component based on the received amplitude code and the second logic path is configured to generate the second component based on the delayed amplitude code.

6. The system as recited in claim 4, wherein, when the sign is negative, the first logic path is configured to generate the first component based on the delayed amplitude code and the second logic path is configured to generate the second component based on the received amplitude code.

7. The system of claim 1, further comprising a digital filter configured to provide the amplitude code to the switching amplifier circuit.

8. The system of claim 1, further comprising a local oscillator circuit configured to generate the clock signal and a complement of the clock signal, wherein the input circuit is configured to receive the clock signal and the complement of the clock signal.

9. The system of claim 8, wherein the input circuit includes:
    a first plurality of flip-flops configured to operate in accordance with the clock signal; and
    a second plurality of flip-flops configured to operate in accordance with the complement of the clock signal.

10. The system of claim 9, wherein ones of the first plurality of flip-flops are coupled to receive a first plurality of bits comprising a magnitude of the amplitude code, and wherein ones of the second plurality of bits are coupled to receive a most significant bit comprising a sign bit of the amplitude code.

11. A method comprising:
    generating a differential signal based on a received amplitude code and a clock signal, wherein the generating is performed by a input circuit of a switching amplifier, and wherein a frequency of the clock signal is a radio frequency (RF) of a transmitter circuit;
    converting the differential signal to a single-ended signal using a conversion circuit of the switching amplifier, wherein converting the differential signal includes:
        providing the differential signal to first and second sub-coils of an inductive-capacitive (LC) tuning circuit, the LC tuning circuit including a variable capacitor coupled between the first and second sub-coils;
        transferring energy, via mutual inductance, from the first and second sub-coils to third and fourth sub-coils of LC tuning circuit; and
        outputting the signal-ended signal on an output node coupled to one of the third and fourth sub-coils; and
    causing an antenna to wirelessly transmit an amplitude modulated (AM) signal received from the conversion circuit.

12. The method of claim 11, further comprising tuning the LC tuning circuit by varying a capacitance of the variable capacitor.

13. The method of claim 11, wherein the amplitude code comprises:
    a most significant bit (MSB) indicative of a sign of the amplitude code; and
    a plurality of least significant bits (LSBs) indicative of a magnitude of the amplitude code.

14. The method of claim 12, further comprising:
generating a delayed amplitude code, using a delay circuit, by applying a delay to the amplitude code;
generating, in a first logic path when the MSB indicates the amplitude is positive, a first component of the differential signal based on the amplitude code as received by the input circuit; and
generating, in a second logic path when the MSB indicates the amplitude is positive, a second component of the differential signal based on the delayed amplitude code.

15. The method of claim 14, further comprising:
generating, in the first logic path when the MSB indicates the amplitude is negative, the first component of the differential signal based on the delayed amplitude code;
generating, in the second logic path when the MSB indicates the amplitude is negative, the second component of the differential signal based on the amplitude code as recited as received by the input circuit.

16. The method of claim 14, further comprising:
generating the clock signal, at the RF, using a local oscillator;
generating a complement of the clock signal, at the RF, using the local oscillator;
generating the delayed amplitude code based on the clock signal and the complement of the clock signal.

17. An apparatus comprising:
a digital filter configured to generate an amplitude code having a plurality of bit including a sign bit indicative of a sign of the amplitude, and a subset of magnitude bits indicative of a magnitude of the amplitude; and
a switching amplifier circuit configured to generate an amplitude modulated (AM) signal for transmission, at a radio frequency (RF), via an antenna, wherein the AM signal is based on the amplitude code, and wherein switching amplifier circuit includes:
 a local oscillator circuit configured to generate a clock signal at the RF;
 an input circuit configured to generate a differential signal based on the amplitude code and the clock signal; and
 a differential-to-single-ended conversion circuit configured to generate the AM signal, using the differential signal, as a single-ended signal, the differential-to-single-ended circuit including an inductive-capacitive (LC) tuning circuit having a first sub-coil, a second sub-coil, and a first capacitor coupled in series between the first sub-coil and the second sub-coil;
 wherein the differential-to-single ended conversion circuit is further configured to convey the AM signal to the antenna for transmission.

18. The apparatus of claim 17, wherein the input circuit includes:
a delay circuit configured to generate a delayed amplitude code by applying a delay to the amplitude code received from the digital filter; and
logic circuitry having first and second logic paths configured to generate first and second components of a differential signal, respectively, based on amplitude code received from the digital filter and the delayed amplitude code;
wherein, when the sign is positive, the first logic path is configured to generate the first component based on the received amplitude code and the second logic path is configured to generate the second component based on the delayed amplitude code.

19. The apparatus of claim 17, wherein the LC tuning circuit further includes a second capacitor coupled in series between a first output terminal of the input circuit and the first sub-coil, and a third capacitor coupled in series between a second output terminal of the input circuit and the second sub-coil.

20. The apparatus of claim 17, wherein the differential-to-single-ended conversion circuit further includes a third sub-coil and a fourth sub-coil coupled in series with one another, wherein the third sub-coil is further coupled to a single-ended output node and the fourth sub-coil is coupled to a ground node, wherein the first and second sub-coils are configured to transfer energy from the differential signal, via mutual inductance, from the first and second sub-coils to the third and fourth sub-coils.

* * * * *